(12) United States Patent
Cho et al.

(10) Patent No.: US 10,777,882 B2
(45) Date of Patent: Sep. 15, 2020

(54) RADAR APPARATUS

(71) Applicant: LG INNOTEK CO., LTD., Seoul (KR)

(72) Inventors: Jeong Hoon Cho, Seoul (KR); Dong Gun Kam, Seoul (KR); Man Seok Kwon, Gyeongsangnam-do (KR)

(73) Assignee: LG INNOTEK CO., LTD., Seoul (KR)

(*) Notice: Subject to any disclaimer, the term of this patent is extended or adjusted under 35 U.S.C. 154(b) by 435 days.

(21) Appl. No.: 15/328,358

(22) PCT Filed: Jul. 9, 2015

(86) PCT No.: PCT/KR2015/007153
§ 371 (c)(1),
(2) Date: Jan. 23, 2017

(87) PCT Pub. No.: WO2016/013790
PCT Pub. Date: Jan. 28, 2016

(65) Prior Publication Data
US 2017/0222314 A1    Aug. 3, 2017

(30) Foreign Application Priority Data
Jul. 22, 2014    (KR) .......................... 10-2014-0092529

(51) Int. Cl.
*H01Q 1/52* (2006.01)
*G01S 7/03* (2006.01)
(Continued)

(52) U.S. Cl.
CPC .............. *H01Q 1/52* (2013.01); *G01S 7/032* (2013.01); *G01S 7/038* (2013.01); *G01S 13/931* (2013.01);
(Continued)

(58) Field of Classification Search
CPC ........... H01Q 1/52–528; H01Q 21/065; H01Q 1/525; H01Q 1/3233; G01S 7/038;
(Continued)

(56) References Cited

U.S. PATENT DOCUMENTS 7,136,029 B2 * 11/2006 Ramprasad .............. H01Q 1/22
343/909
7,471,247 B2 * 12/2008 Saily ...................... H01Q 1/523
343/700 MS (Continued)

FOREIGN PATENT DOCUMENTS

CN        103874323 A   *   6/2014
JP        2005091238 A       4/2005
(Continued)

OTHER PUBLICATIONS

Yang et al. "Microstrip Antennas Integrated With Electromagnetic Band-Gap (EBG) Structures: A Low Mutual Coupling Design for Array Applications". IEEE Transactions on Antennas and Propagation, vol. 51, No. 10, Oct. 2003. pp. 2936-2946. (Year: 2003).*

(Continued)

*Primary Examiner* — Matthew M Barker
(74) *Attorney, Agent, or Firm* — Saliwanchik, Lloyd & Eisenschenk (57) ABSTRACT

There is provided a radar apparatus comprising: a substrate; multiple antenna elements mounted on the substrate; and a signal-coupling suppressor disposed between the multiple antenna elements.

17 Claims, 10 Drawing Sheets (51) Int. Cl.
*H01Q 21/06* (2006.01)
*G01S 13/931* (2020.01)
*G01S 7/02* (2006.01)
*H01Q 1/32* (2006.01)

(52) U.S. Cl.
CPC .......... *H01Q 1/525* (2013.01); *H01Q 21/065* (2013.01); *G01S 2007/027* (2013.01); *G01S 2007/028* (2013.01); *H01Q 1/3233* (2013.01)

(58) Field of Classification Search
CPC .......... G01S 7/032; G01S 13/931; G01S 7/03; G01S 2007/028; G01S 2007/027
See application file for complete search history.

(56) References Cited

U.S. PATENT DOCUMENTS

| | | | | |
|---|---|---|---|---|
| 7,626,216 | B2* | 12/2009 | McKinzie | H01P 1/20 257/192 |
| 7,973,619 | B2* | 7/2011 | Cho | H01P 1/2005 174/262 |
| 8,288,660 | B2* | 10/2012 | Kim | H05K 1/0236 174/261 |
| 8,598,468 | B2* | 12/2013 | Kim | H01P 1/2005 174/255 |
| 8,699,234 | B2* | 4/2014 | Kim | H05K 1/0236 343/700 MS |
| 8,749,322 | B2* | 6/2014 | Wu | H05K 1/0236 333/185 |
| 8,816,921 | B2* | 8/2014 | Ayatollahi | H01Q 1/243 343/702 |
| 8,981,998 | B2* | 3/2015 | Orime | G01S 7/032 343/700 MS |
| 9,084,351 | B2* | 7/2015 | Toyao | H05K 1/0236 |
| 9,231,291 | B2* | 1/2016 | Kim | H01P 11/007 |
| 9,357,633 | B2* | 5/2016 | Kobayashi | H01Q 15/008 |
| 9,419,335 | B2* | 8/2016 | Pintos | H01Q 1/525 |
| 9,553,371 | B2* | 1/2017 | MacDonald | H01Q 1/425 |
| 9,634,370 | B2* | 4/2017 | Toyao | H01P 1/2005 |
| 9,653,767 | B2* | 5/2017 | Toyao | H01P 1/2005 |
| 2003/0058133 | A1 | 3/2003 | Arnold et al. | |
| 2008/0136710 | A1* | 6/2008 | Nefedov | H01Q 1/2283 343/700 MS |
| 2008/0165063 | A1 | 7/2008 | Schlub et al. | |
| 2010/0180437 | A1* | 7/2010 | McKinzie, III | H01P 1/20 29/825 |
| 2011/0212697 | A1* | 9/2011 | Aoki | H01Q 3/44 455/131 |
| 2011/0315440 | A1* | 12/2011 | Kim | H01P 1/2005 174/266 |
| 2012/0086593 | A1* | 4/2012 | Weber | G01S 7/4026 342/146 |
| 2012/0325544 | A1* | 12/2012 | Toyao | H05K 1/0236 174/266 |
| 2013/0241778 | A1* | 9/2013 | Orime | H01Q 1/38 343/700 MS |
| 2015/0008994 | A1* | 1/2015 | Kobayashi | H01P 3/122 333/24 R |

FOREIGN PATENT DOCUMENTS

| | | |
|---|---|---|
| JP | 2005094440 A | 4/2005 |
| JP | 2010210297 A | 9/2010 |
| KR | 20100042704 A | 4/2010 |
| KR | 20140026832 A | 3/2014 |

OTHER PUBLICATIONS

International Search Report in International Application No. PCT/KR2015/007153, filed Jul. 9, 2015.

* cited by examiner

RADAR APPARATUS

CROSS-REFERENCE TO RELATED APPLICATIONS

This application is the U.S. national stage application of International Patent Application No. PCT/KR2015/007153, filed Jul. 9, 2015, which claims priority to Korean Application No. 10-2014-0092529, filed Jul. 22, 2014, the disclosures of each of which are incorporated herein by reference in their entirety.

BACKGROUND

Field of the Present Disclosure

The present disclosure relates to a radar apparatus.

Discussion of Related Art

In general, the radar apparatus is applied to various technical fields. The radar apparatus can be mounted on a vehicle to improve the mobility of the vehicle. The radar apparatus uses electromagnetic waves to detect information about the surroundings of the vehicle. Since the information on the surrounding environment is used during moving the vehicle, the efficiency of the vehicle mobility can be improved. The radar apparatus includes multiple antenna elements.

However, the radar apparatus may cause electromagnetic mutual coupling between antenna elements during operation. That is, the signal generated by one of the antenna elements can interfere with the other. This problem becomes more serious as the size of the radar apparatus becomes smaller, which causes the performance degradation of the radar apparatus.

SUMMARY

The present disclosure is to provide a radar apparatus to suppress electromagnetic mutual coupling between antenna elements. That is, although the radar apparatus is smaller, the electromagnetic mutual coupling between the antenna elements may be efficiently suppressed.

In one aspect of the present disclosure, there may be provided a radar apparatus comprising: a substrate; multiple antenna elements mounted on the substrate; and a signal-coupling suppressor disposed between the multiple antenna elements.

In one implementation, the signal-coupling suppressor may include: conductive primary cells spaced from each other; and bridges, each bridge allowing electrical connection between adjacent primary cells.

In one implementation, the primary cells may be arranged in multiple rows and columns.

In one implementation, the substrate may include a mount layer on which the signal-coupling suppressor is mounted.

In one implementation, the cells and bridges may be mounted on the mount layer on a top face thereof.

In one implementation, the signal-coupling suppressor may be mounted on the mount layer on a bottom face thereof. The signal-coupling suppressor may further include additional conductive cells mounted on the mount layer on a bottom face thereof, wherein the additional cells vertically overlap the primary cells respectively. The signal-coupling suppressor may further include vertical connectors vertically passing through the mount layer, wherein the vertical connectors allow respective electrical connections between the additional cells and primary cells.

As for the radar apparatus in accordance with an embodiment of the present disclosure, the signal-coupling suppressor is disposed between the antenna elements, thereby to suppress the operating frequency band of the antenna elements. That is, the signal-coupling suppressor may suppress the electromagnetic mutual coupling between the antenna elements. In this way, although the radar apparatus is smaller, the electromagnetic mutual coupling between the antenna elements may be efficiently suppressed.

DETAILED DESCRIPTIONS

Examples of various embodiments are illustrated and described further below. The same reference numbers in different figures denote the same or similar elements, and as such perform similar functionality. It will be understood that the present disclosure may be practiced without specific details. In other instances, well-known methods, procedures, and components have not been described in detail so as not to unnecessarily obscure aspects of the present disclosure.

Figure 1:
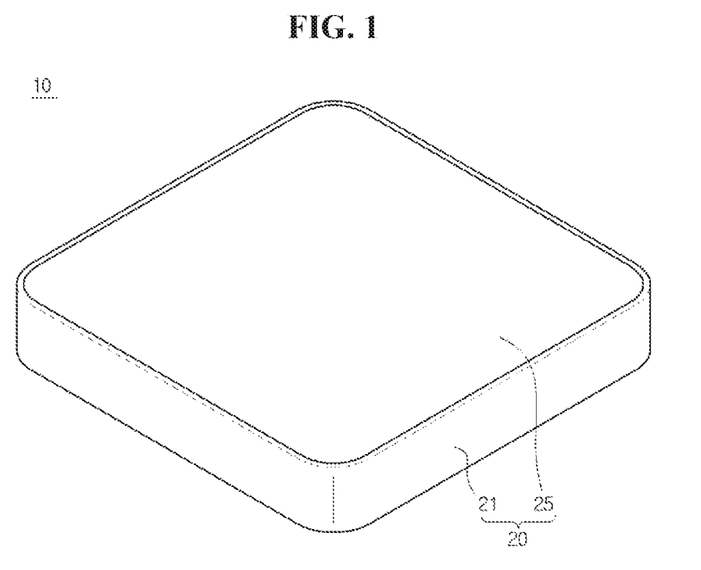
FIG. 1 is a perspective view of a radar apparatus in accordance with an embodiment of the present disclosure.

FIG. 1 is a perspective view of a radar apparatus in accordance with an embodiment of the present disclosure. Further, FIG. 2 is an exploded perspective view of a radar apparatus in accordance with an embodiment of the present disclosure.

Figure 2:
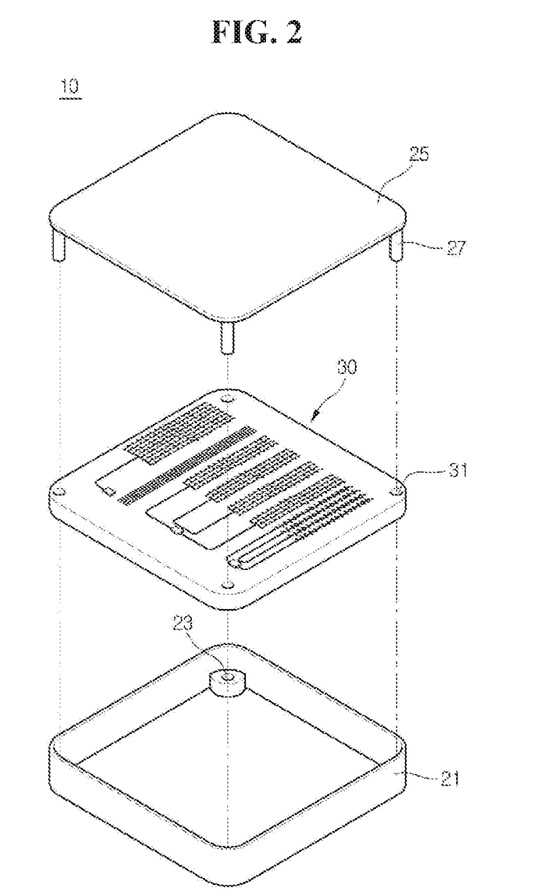
FIG. 2 is an exploded perspective view of a radar apparatus in accordance with an embodiment of the present disclosure.

Referring to FIG. 1 and FIG. 2, the radar apparatus 10 in accordance with an embodiment of the present disclosure 10 may include a housing 20 and a radar module the radar module 30.

The housing 20 may protect the radar module 30. To this end, the housing 20 may house the radar module 30. This housing 20 may include a lower housing 21 and an upper housing 25. In this connection, the lower housing 21 and/or upper housing 25 may have a dome shape. In this regard, each of the lower housing 21 and upper housing 25 may have a circular or polygonal contour shape. Further, the housing 20 may be made of an insulating material.

The lower housing 21 may support the radar module 30. In this connection, the lower housing 21 may have engaged grooves 23. In this regard, the engaged grooves 23 may be located in edges of the lower housing 21 respectively. For example, the engaged grooves 112 may be located in corners of the lower housing 21 respectively.

The upper housing 25 may allow a radar signal from the radar module 30 to transmit therethrough. To this end, the upper housing 25 may be made of a material with high transmittance, low internal reflection and great strength. In this regard, the upper housing 25 may be made of a plastic such as a glass fiber. In this connection, the upper housing 25 may include engaging members 27. In this regard, engaging members 27 may be located in the upper housing 25 to position-correspond with the engaged grooves 23 of the lower housing 21 respectively. Specifically, the engaging members 27 may vertically overlap the engaged grooves 23 respectively. This upper housing 25 may be mounted onto the lower housing 21. In this connection, the lower housing 21 and upper housing 25 may be coupled to each other at corners thereof. In this regard, the engaging members 27 of the upper housing 25 may be inserted into the engaged grooves 23 of the lower housing 21 respectively.

The radar module 30 may generate the radar signal. Further, the radar module 30 may emit the radar signal into an air. Moreover, the radar module 30 may receive the radar signal from an air. In this regard, the radar signal may be reflected from an object near the radar apparatus 10 to the radar module 30. In this connection, the radar module 30 may transmit and receive the radar signal over a predetermined operating frequency band.

This the radar module 30 may be disposed in the housing 20. In this connection, the radar module 30 may have through-holes 31 defined therein. In this regard, through-holes 31 may be located in the radar module 30 to position-correspond to the engaged grooves 23 of the lower housing 21 and the engaging members 27 of the upper housing 25 respectively. Specifically, through-holes 31 may vertically overlap the engaged grooves 23 of the lower housing 21 and the engaging members 27 of the upper housing 25 respectively. In this way, when the lower housing 21 and upper housing 25 are coupled to each other, the engaging members 27 may pass through the through-holes 31 into the engaged grooves 23 respectively.

Although, in this embodiment, the engaging members 27 are integrated with the upper housing 25, the present disclosure is not limited thereto. That is, the engaging members 27 may be separate components from the upper housing 25. For example, the engaging members 27 outside of the upper housing 25 may pass downwardly through the upper housing 25. Further, the engaging members 27 may be inserted into the engaged groove 23 of the lower housing 21 respectively.

Figure 3:
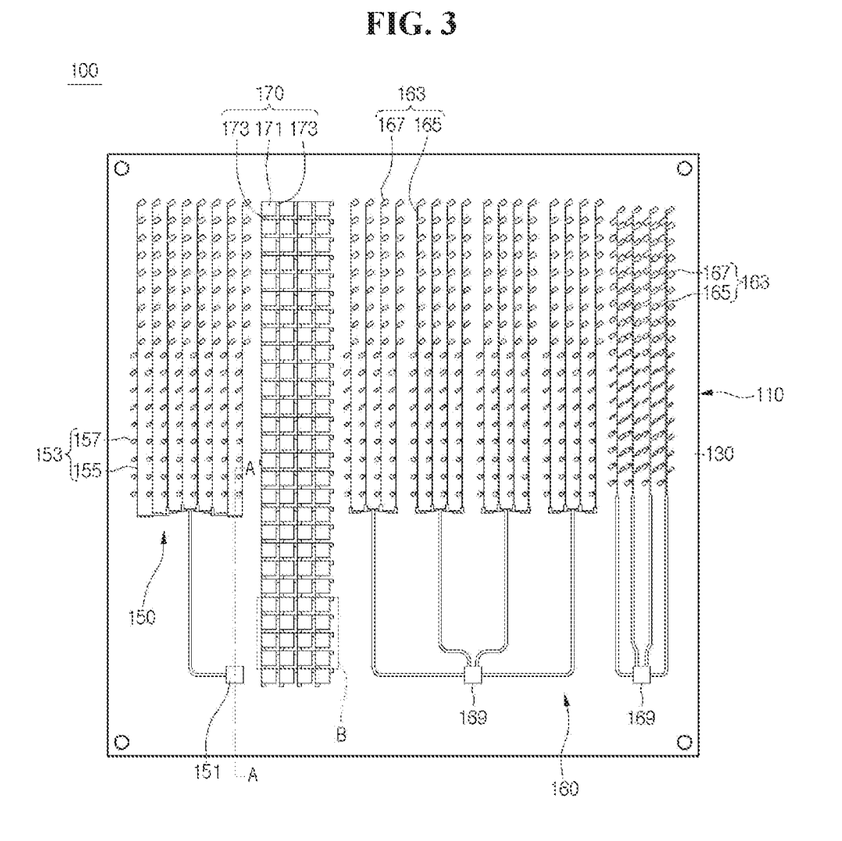
FIG. 3 is a top view of a radar module in accordance with a first embodiment of the present disclosure.
Figure 4:
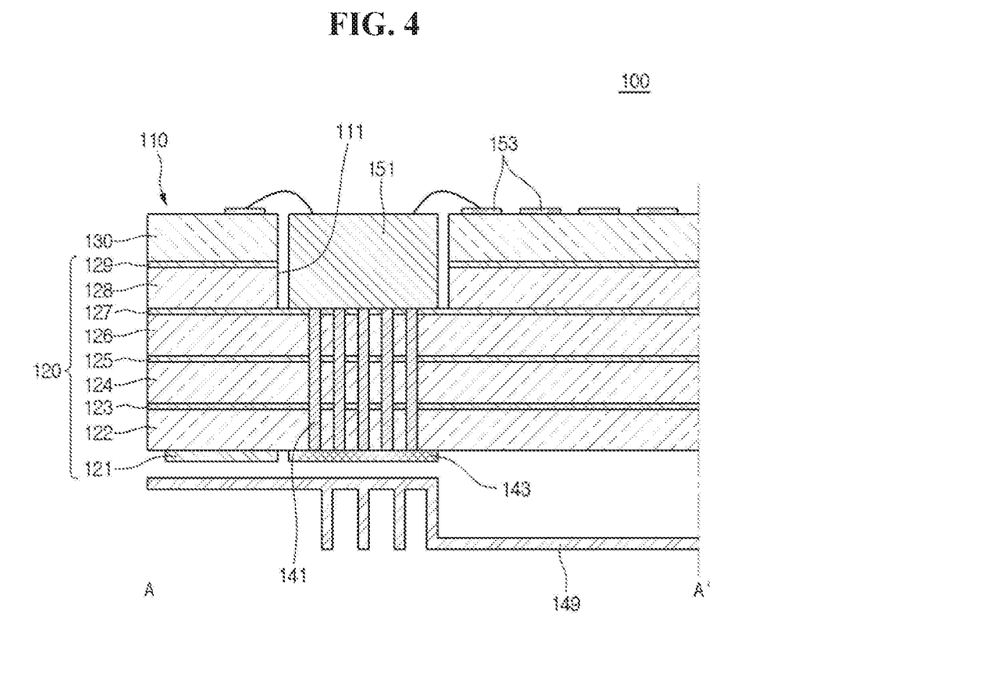
FIG. 4 is a cross-sectional view taken at a line A-A' in FIG. 3.
Figure 5:
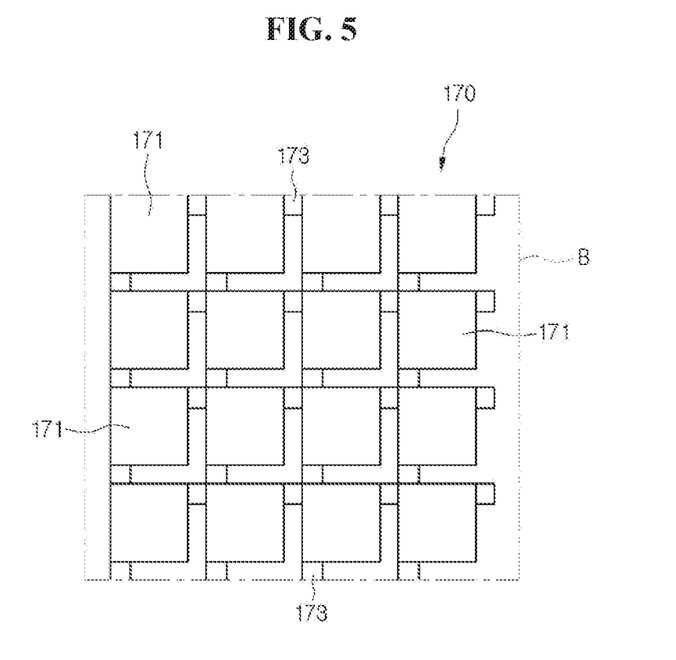
FIG. 5 is an enlarged view of a B region in FIG. 3.
Figure 6:
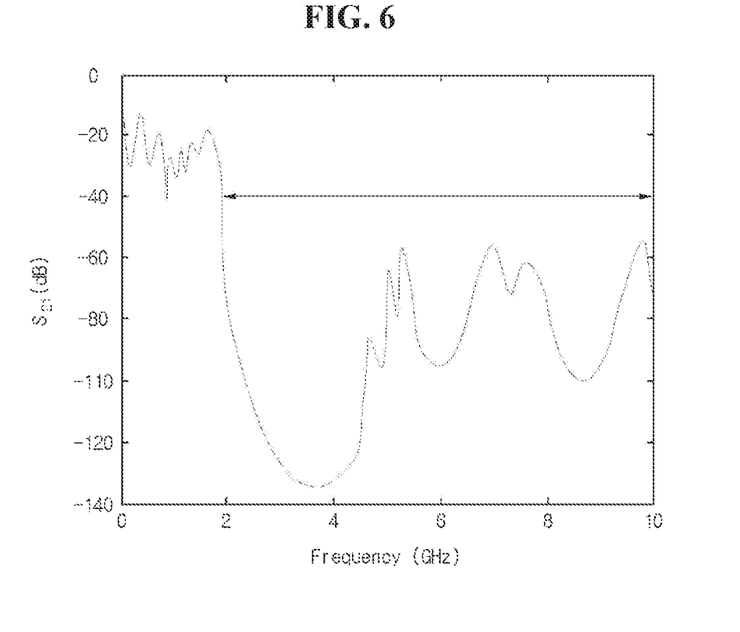
FIG. 6 is a graph for describing an operational characteristic of the radar module in accordance with the first embodiment of the present disclosure.
Figure 7:
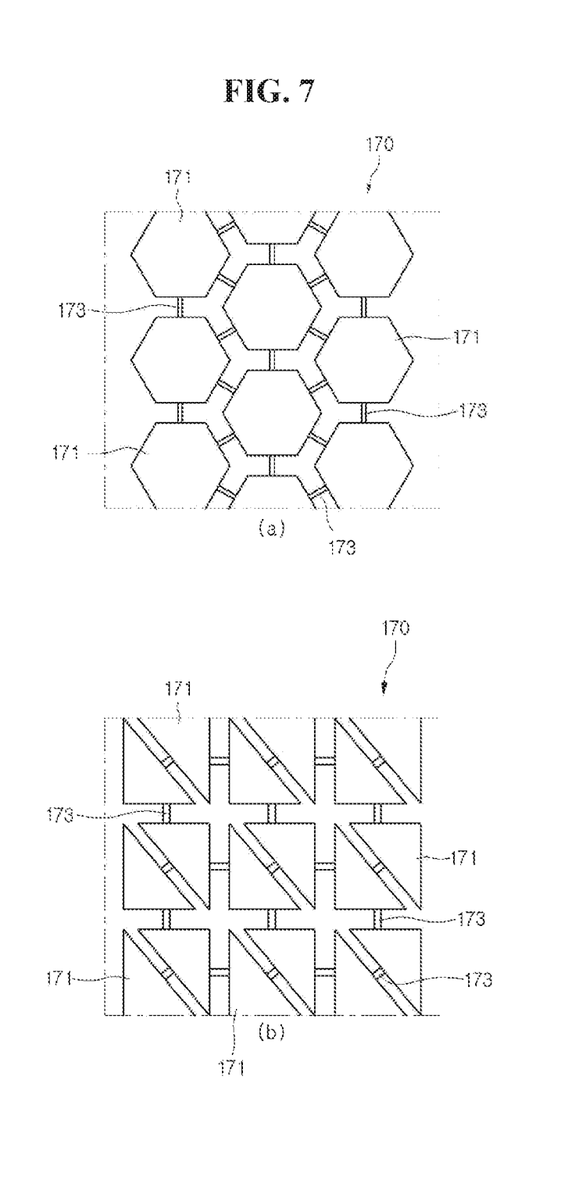
FIG. 7 is a top view of a variation of the radar module in accordance with the first embodiment of the present disclosure.

FIG. 3 is a top view of a radar module in accordance with a first embodiment of the present disclosure. FIG. 4 is a cross-sectional view taken at a line A-A' in FIG. 3. Further, FIG. 5 is an enlarged view of a B region in FIG. 3. Moreover, FIG. 6 is a graph for describing an operational characteristic of the radar module in accordance with the first embodiment of the present disclosure. FIG. 7 is a top view of a variation of the radar module in accordance with the first embodiment of the present disclosure.

Referring to FIG. 3 and FIG. 4, the radar module 100 may include a substrate 110, a radar transmitter 150, a radar receiver 160, and a signal-coupling suppressor 170.

The substrate 110 as a base of the radar module 100 may support the radar transmitter 150, the radar receiver 160 and the signal-coupling suppressor 170 thereon. In this connection, the substrate 110 may be planar. Further, the substrate 110 may have a multi-layered structure. In this regard, the substrate 110 may have at least one recess 111 defined therein. Moreover, the recess 111 may be formed in the substrate 110 at a top portion thereof. This substrate 110 may include a support stack 120, a mount layer 130, an at least one thermal diffusion via 141, a thermal diffusion pad 143 and a heat dissipation member 149.

The support stack 120 may support the mount layer 130, the at least one thermal diffusion via 141 and the thermal diffusion pad 143. In this connection, the support stack 120 may include a stack of multiple ground layers 121, 123, 125, 127 and 129 and multiple support layers 122, 124, 126 and 128. In this connection, the ground layers 121, 123, 125, 127 and 129 and support layers 122, 124, 126 and 128 may be vertically stacked in an alternated manner on a bottom of the substrate 110.

The support layers 122, 124, 126 and 128 may be stacked in this order. In this connection, the support layers 122, 124, 126 and 128 may divided into a first support layers group 122, 126 and a second support layers group 124, 128 based on materials thereof. Further, the first support layers 122, 126 may be alternated with the second support layers 124, 128. In this regard, the first support layers group 122, 126 may be made of FR-4, while the second support layers group 124, 128 may be made of prepreg. Alternatively, the first support layers group 122, 126 may be made of prepreg, while the second support layers group 124, 128 may be made of FR-4.

The ground layers 121, 123, 125, 127 and 129 may act to spread heats from the radar module 100 and to block noises. The ground layers 121, 123, 125, 127 and 129 may be vertically alternated with the support layers 121, 123, 125, 127 and 129 respectively. In this regard, one of the ground layers 121, 123, 125, 127 and 129 may be disposed as a bottom of the support stack 120. Further, another of the ground layers 121, 123, 125, 127 and 129 may be disposed as a top of the support stack 120. In this connection, each of the ground layers 121, 123, 125, 127 and 129 may be planar. Moreover, each of the ground layers 121, 123, 125, 127 and 129 may be made of a metal. In this regard, the metal may be at least one selected from sliver (Ag), palladium (Pd), platinum (Pt), copper (Cu), gold (Au), and nickel (Ni).

The mount layer 130 may be disposed on the support stack 120. In this connection, the mount layer 130 may be made of a different material from that of each of the support layers 122, 124, 126 and 128. In this regard, the mount layer 260 may be made of Teflon.

In this connection, the recess 111 may be defined in the substrate 110 at the top portion thereof. In this connection, the recess 111 may vertically entirely pass through the mount layer 130. Alternatively, the recess 111 may vertically and at least partially pass through the mount layer 130 and support stack 120. In this regard, the recess 111 may pass through at least one of the ground layers 121, 123, 125, 127 and 129 and support layers 122, 124, 126 and 128. Further, the recess 111 may expose at least one of the ground layers 121, 123, 125, 127 and 129 and support layers 122, 124, 126 and 128. In this regard, at least one of the ground layers 121, 123, 125, 127 and 129 and support layers 122, 124, 126 and 128 may be present in the recess 111.

The at least one thermal diffusion via 141 may vertically extend from the recess 111 through the support stack 120 to the bottom thereof. In this connection, the at least one thermal diffusion via 141 may be exposed from the recess 111. Further, the at least one thermal diffusion via 141 may vertically pass through the support stack 120.

The thermal diffusion pad 143 may be disposed on a bottom of the support stack 120. In this connection, the thermal diffusion pad 143 may be spaced from one of the ground layers 121, 123, 125, 127 and 129, in this example, the layer 121. Further, the thermal diffusion pad 143 may contact the at least one thermal diffusion via 141.

The heat dissipation member 147 may act to dissipate heat from the radar module 100 outwardly. This heat dissipation member 147 may be disposed under the support stack 120. Further, the heat dissipation member 147 may dissipate heat outwardly, wherein the heat may be collected toward the member 147 from the radar transmitter 150, the radar receiver 160 and the signal-coupling suppressor 170 via at least one thermal diffusion via 141 and thermal diffusion pad 143. In this connection, the heat dissipation member 149 may contact the thermal diffusion pad 143 which in turn may contact the thermal diffusion via 141.

The radar transmitter 150 as a component of the radar module 100 may transmit the radar signal. In this connection, the radar transmitter 150 may transmit the radar signal over a predetermined operating frequency band. In this regard, the radar transmitter 150 may transmit the radar signal using one transmission channel Tx. Further, the radar transmitter 150 may transmit the radar signal periodically. This the radar transmitter 150 may be mounted on the substrate 110. In this connection, the radar transmitter 150 may include a transmission unit 151 and transmission antenna element 153.

The transmission unit 151 may generate the radar signal from transmission data. In this connection, the transmission unit 151 may generate the radar signal based on the operating frequency band. That is, the transmission unit 151 may generate the radar signal based on the transmission channel Tx. In this regard, the transmission unit 151 may have an oscillator. For example, the oscillator may be embodied as VCO (Voltage Controlled Oscillator). This transmission unit 151 may be embedded in the recess 111 in the substrate 110. Further, the transmission unit 151 may contact the thermal diffusion via 143 in the recess 111.

The transmission antenna element 153 may emit the radar signal into an air. In this connection, the transmission antenna element 153 may emit the radar signal using the operating frequency band. This transmission antenna element 153 may be disposed on the substrate 110. In this regard, transmission antenna element 153 may be mounted on the mount layer 130. In this connection, the transmission antenna element 153 may be made of a conductive material. In this regard, the conductive material may be at least one selected from sliver (Ag), palladium (Pd), platinum (Pt), copper (Cu), gold (Au), and nickel (Ni).

In this connection, the transmission antenna element 153 may include a power feeder 155 and multiple signal emitters 157. The power feeder 155 may be connected to the transmission unit 151. Further, the power feeder 155 may receive the radar signal from the transmission unit 151 and transfer the radar signal to the signal emitters 157. The signal emitters 157 may be distributed across the power feeder 155. Moreover, the signal emitters 157 may emit the radar signal into an air.

The radar receiver 160 as a component of the radar module 100 may receive the radar signal. In this connection, the radar receiver 160 may receive the radar signal over the operating frequency band. In this regard, the radar receiver 160 may receive the radar signal using multiple receiving channels Rx1, Rx2. This radar receiver 160 may be mounted on the substrate 110. In this connection, the radar receiver 160 may include multiple receiving antenna elements 163 and multiple receiving units 169. In this regard, the receiving channels Rx1, Rx2 may assigned to the receiving antenna elements 163 respectively. The receiving antenna elements 163 may correspond to the receiving units 169 respectively.

The receiving antenna element 163 may receive the radar signal from an air. In this connection, the receiving antenna elements 163 may receive the radar signal over the operating frequency band. In this regard, the receiving antenna elements 163 may receive the radar signal using the receiving channel Rx1, Rx2 respectively. Further, receiving antenna elements 163 may transfer the radar signal to the receiving units 169. The receiving antenna elements 163 may be disposed on the substrate 110. In this regard, the receiving antenna elements 163 may be mounted on the mount layer 130. In this connection, the receiving antenna elements 163 may be made of a conductive material. In this regard, the conductive material may be at least one selected from sliver (Ag), palladium (Pd), platinum (Pt), copper (Cu), gold (Au), and nickel (Ni).

In this connection, each of the receiving antenna elements 163 may include a power feeder 165 and multiple signal emitters 167. The power feeder 165 may be connected to a corresponding receiving unit 169. The signal emitters 167 may be distributed across the power feeder 165. Further, the signal emitters 167 may receive the radar signal. Moreover, the signal emitters 167 may transfer the radar signal to the power feeder 165.

The receiving units 169 may generate receiving data from the radar signal. In this connection, the receiving units 169 may generate receiving data based on the receiving channels Rx1, Rx2. That is, the receiving units 169 may generate receiving data over the receiving channels Rx1, Rx2 respectively. In this regard, each of the receiving units 169 may include a LNA (Low Noise Amplifier), ADC (Analog-to-Digital Converter), etc. The LNA may perform low noise amplification for the radar signal. The ADC may convert the radar signal from an analog form to a digital form to generate the receiving data. The receiving units 169 may be embedded in the recess 111 in the substrate 110. Further, the receiving units 169 may contact the thermal diffusion via 143 in the recess 111.

The signal-coupling suppressor 170 may block the operating frequency band in the radar module 100. In this connection, the signal-coupling suppressor 170 may allow isolation between the transmission antenna element 153 and receiving antenna elements 163. This signal-coupling suppressor 170 may be mounted on the substrate 110. In this regard, the signal-coupling suppressor 170 may have a single layered structure. Further, the signal-coupling suppressor 170 may be disposed between the transmission antenna element 153 and receiving antenna elements 163. Moreover, the signal-coupling suppressor 170 may be made of a conductive material. In this regard, the conductive material may be at least one selected from sliver (Ag), palladium (Pd), platinum (Pt), copper (Cu), gold (Au), and nickel (Ni).

In this connection, the signal-coupling suppressor 170 may have a cell structure. In this regard, the signal-coupling suppressor 170 may have a cell structure as shown in FIG. 5. This signal-coupling suppressor 170 may include multiple cells 171 and multiple bridges 173.

The cells 171 may be disposed on the substrate 110. In this regard, the cells 171 may be mounted on the mount layer 130. Further, the cells 171 may be arranged so as to be spaced from each other. In this regard, the cells 171 may be arranged in multiple rows and columns. In this connection, between the cells 171, a gap may be defined with a spacing g. That is, in this gap, a metal material is free. Moreover, the cells 171 may be spaced from each other with the spacing g. Further, each of the cells 171 may have a polygonal shape. In this regard, each of the cells 171 may have a rectangular shape.

The bridges 173 may be disposed on the substrate 110. In this regard, the bridges 173 may be mounted on the mount layer 130. Further, the bridges 173 may allow electrical connections between the cells 171. In this connection, each of the bridges 173 may be formed in each gap between the cells 171. That is, each of the bridges 173 may extend between adjacent cells 171.

Further, a shape and size of the signal-coupling suppressor 170 may depend on the operating frequency band. Specifically, a size of the cell 171, a size of the bridge 173 and/or a spacing between the cells 171 may depend on the operating frequency band. In this way, when the radar module 100 operates, the signal-coupling suppressor 170 may generate inductance and capacitance. Moreover, based on the inductance and capacitance, the signal-coupling suppressor 170 may block the operating frequency band. In this connection, the signal-coupling suppressor 170 may block the operating frequency band as shown in FIG. 6. In this regard, the signal-coupling suppressor 170 may block an interference signal over a frequency band of about 2 GHz to 10 GHz. That is, the signal-coupling suppressor 170 may suppress electromagnetic mutual coupling between the transmission antenna element 153 and receiving antenna elements 163.

Although, in this embodiment, each of the cells 171 of the signal-coupling suppressor 170 has the rectangular shape, the present disclosure is not limited thereto. That is, the non-rectangular shape of each of the cells 171 may be possible to implement the signal-coupling suppressor 170. In other words, each of the cells 171 may have various shapes. For example, each of the cells 171 may have a hexagonal shape as shown in FIG. 7A. In an alternative, each of the cells 171 may have a triangular shape as shown in FIG. 7B.

Figure 8A:
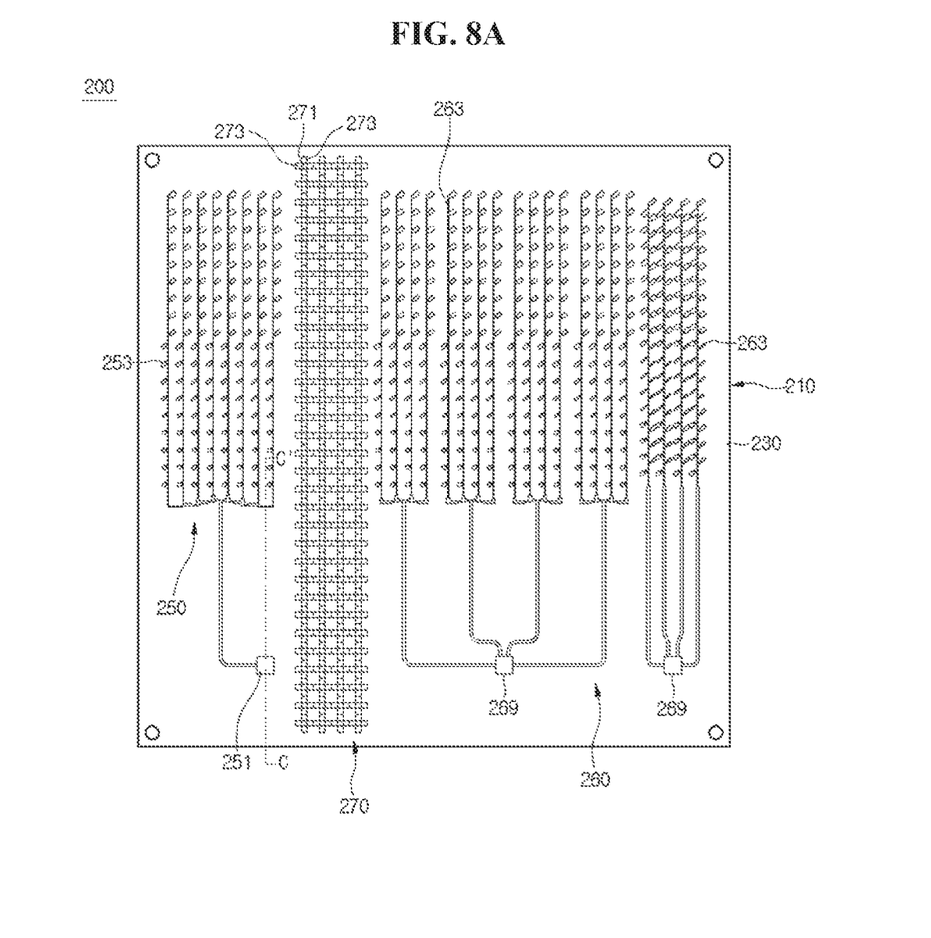
FIG. 8A and FIG. 8B show a radar module in accordance with a second embodiment of the present disclosure.
Figure 8B:
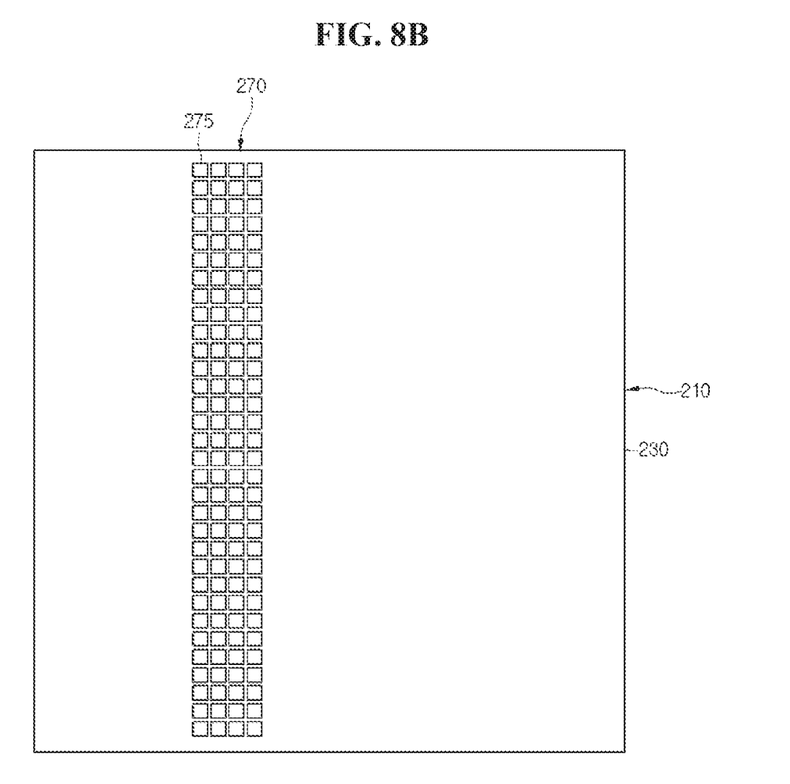
Figure 9:
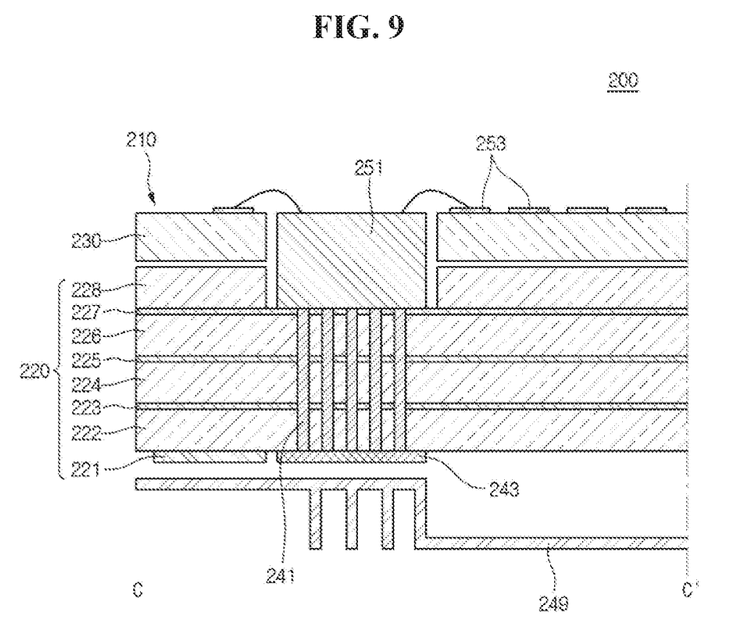
FIG. 9 is a cross-sectional view taken in a C-C' in FIG. 8A.
Figure 10:
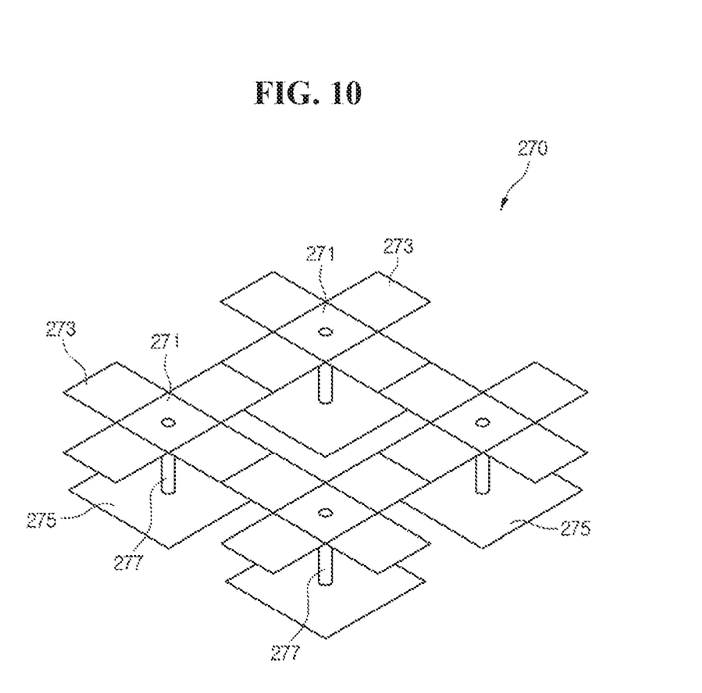
FIG. 10 is a partial enlarged perspective view of a signal-coupling suppressor in FIG. 8A and FIG. 8B.

FIG. 8A and FIG. 8B show a radar module in accordance with a second embodiment of the present disclosure. In this connection, FIG. 8A is a top view of a mount layer in the radar module in accordance with the second embodiment of the present disclosure. FIG. 8B is a bottom view of a mount layer in the radar module in accordance with the second embodiment of the present disclosure. Further, FIG. 9 is a cross-sectional view taken in a C-C' in FIG. 8A. FIG. 10 is a partial enlarged perspective view of a signal-coupling suppressor in FIG. 8A and FIG. 8B.

Referring FIG. 8A, FIG. 8B, FIG. 9 and FIG. 10, the radar module 200 in accordance with the second embodiment of the present disclosure may include a substrate 210, a radar transmitter 250, a radar receiver 260 and a signal-coupling suppressor 270. Further, the substrate 210 may include a support stack 220, a mount layer 230, at least one thermal diffusion via 241, a thermal diffusion pad 243 and a heat dissipation member 249. In this connection, the support stack 220 may include multiple ground layers 221, 223, 225 and 227 and multiple support layers 222, 224, 226 and 228. Moreover, the radar transmitter 250 may include a transmission unit 251 and transmission antenna element 253. The radar receiver 260 may include multiple receiving antenna elements 263 and multiple receiving units 269. In this connection, the above components in this second embodiment have the same configurations as those in the first embodiment. Thus, detailed descriptions thereof may be omitted.

In one embodiment, the signal-coupling suppressor 270 may have a multi-layered structure. To this end, one of the support layers 222, 224, 226 and 228 may serve as a top of the support stack 220. In other words, any one of the ground layers 221, 223, 225 and 227 does not serve as a top of the support stack 220. Further, the signal-coupling suppressor 270 may be disposed on top and bottom faces of the mount layer 130.

In this connection, the signal-coupling suppressor 270 may have a cell structure. This signal-coupling suppressor 270 may include multiple cells 271, multiple bridges 273, multiple additional cells 275, and multiple vertical connectors 277.

The cells 271 may be disposed on the substrate 210. In this regard, the cells 271 may be mounted on the mount layer 230 on a top face thereof. Further, the cells 271 may be arranged so as to be spaced from each other. In this regard, the cells 271 may be arranged in multiple rows and columns. In this connection, between the cells 271, a gap may be defined with a spacing g. That is, in this gap, a metal material is free. Moreover, the cells 271 may be spaced from each other with the spacing g. Further, each of the cells 271 may have a polygonal shape. In this regard, each of the cells 271 may have a rectangular shape.

The bridges 273 may be disposed on the substrate 210. In this regard, the bridges 273 may be mounted on the mount layer 230 on the top face thereof. Further, the bridges 273 may allow electrical connections between the cells 271. In this connection, each of the bridges 273 may be formed in each gap between the cells 271. That is, each of the bridges 273 may extend between adjacent cells 271.

The additional cells 275 may be mounted on the mount layer 230 on a bottom face thereof. Further, the additional cells 275 may be arranged to be spaced from each other. In this regard, additional cells 275 may be arranged in multiple rows and columns. In this connection, between the additional cells 275, a second gap may be defined with a spacing ga. That is, in this second gap, a metal material is free. Moreover, the additional cells 275 may be spaced from each other with the spacing ga. Further, each of the additional cells 275 may have an elliptic or a polygonal shape. In this regard, each of the additional cells 275 may have a rectangular shape.

The vertical connectors 277 may allow electrical connections between the upper cells 271 and lower additional cells 275. In this regard, the vertical connectors 277 allow respective electrical connection between the upper cells 271 and lower additional cells 275. Further, the vertical connectors 277 may vertically pass through the mount layer 230. In this connection, each of the vertical connectors 277 may have one end contacting the corresponding cell 271 and the other end contacting the corresponding additional cell 275. Thus, the vertical connectors 277 may pass through the mount layer 230.

Further, a shape and size of the signal-coupling suppressor 270 may depend on the operating frequency band. Specifically, a size of the cell 271, a size of the bridge 273, a spacing g between the cells 271, a size of the additional cell 275, a spacing ga between the additional cells 275, a size of the connector 277 and/or a height of the connector may depend on the operating frequency band. In this way, when the radar module 200 operates, the signal-coupling suppressor 270 may generate inductance and capacitance. Moreover, based on the inductance and capacitance, the signal-coupling suppressor 270 may block the operating frequency band. That is, the signal-coupling suppressor 270 may suppress electromagnetic mutual coupling between the transmission antenna element 253 and receiving antenna elements 263.

Although, in this embodiment, each of the cells 271 of the signal-coupling suppressor 270 has the rectangular shape, the present disclosure is not limited thereto. That is, the non-rectangular shape of each of the cells 271 may be possible to implement the signal-coupling suppressor 270. In other words, each of the cells 271 may have various shapes. For example, each of the cells 271 may have a hexagonal shape. In an alternative, each of the cells 271 may have a triangular shape.

Moreover, although, in this embodiment, each of the additional cells 275 of the signal-coupling suppressor 270 has the rectangular shape, the present disclosure is not limited thereto. That is, the non-rectangular shape of each of the additional cells 275 may be possible to implement the signal-coupling suppressor 270. In other words, each of the additional cells 275 may have various shapes. For example, each of the additional cells 275 may have a hexagonal shape. In an alternative, each of the additional cells 275 may have a triangular shape.

Moreover, although, in this embodiment, the signal-coupling suppressor 170 or 270 is disposed between the transmission antenna element 153 or 253 and receiving antenna elements 163 or 263, the present disclosure is not limited thereto. That is, the signal-coupling suppressor 170 or 270 being disposed between the receiving antenna elements 163 or 263 may be possible to implement the signal-coupling suppression. In other words, the signal-coupling suppressor 170 or 270 may be disposed between the transmission antenna element 153 or 253 and the receiving antenna elements 163 or 263, and/or may be disposed between the receiving antenna elements 163 or 263.

Moreover, although, in this embodiment, the transmission unit 151 or 251 and receiving units 169 or 269 are disposed on the substrate 110 or 210 on a top face thereof, the present disclosure is not limited thereto. That is, the transmission unit 151 or 251 and receiving units 169 or 269 may be disposed on the substrate 110 or 210 on a bottom face thereof. To this end, at least one recess 111 may be formed in the substrate 110 or 210 in the bottom portion thereof. For example, the recess 111 may be formed in the support stack 120 or 220 in the top portion or bottom portion thereof. Further, the transmission unit 151 or 251 and receiving units 169 or 269 may be embedded in the recess 111 in the substrate 110 or 210.

In this connection, the substrate 110 or 210 may further include a waveguide (not shown). The waveguide may be formed between the support stack 120 or 220 and mount layer 130 or 230. The waveguide may have at least one wave guide channel defined therein. The at least one wave guide channel may act to transfer the radar signal between the transmission unit 151 or 251 and transmission antenna element 153 or 253 and between the receiving antenna elements 163 or 263 and receiving units 169 or 269. In this regard, the at least one wave guide channel may pass through the support stack 120 or 230.

In accordance with the present disclosure, the signal-coupling suppressor 170 or 270 may be disposed between the antenna elements 153 and 163; or 253 and 263, to block the operating frequency band of the antenna elements 153 and 163; or 253 and 263. That is, the signal-coupling suppressor 170 or 270 may suppress the electromagnetic mutual coupling between the antenna elements 153 and 163; or 253 and 263. In this way, although the radar apparatus 10 in FIG. 1 is smaller, the electromagnetic mutual coupling between the antenna element 153 and 163; or 253 and 263 may be suppressed.

Examples of various embodiments have been illustrated and described above. It will be understood that the description herein is not intended to limit the claims to the specific embodiments described. On the contrary, it is intended to cover alternatives, modifications, and equivalents as may be included within the spirit and scope of the present disclosure as defined by the appended claims.

What is claimed is:

1. A radar apparatus comprising:
a substrate;
multiple antenna elements mounted on the substrate; and
a signal-coupling suppressor disposed between the multiple antenna elements,
wherein the signal-coupling suppressor comprises:
first and second layers of conductive cells vertically spaced apart from each other, each layer comprising a plurality of conductive cells horizontally spaced apart from each other;
a plurality of bridges interposed between horizontally adjacent conductive cells of the first layer of conductive cells, respectively, each bridge electrically connecting the horizontally adjacent cells; and
a plurality of connectors interposed between vertically adjacent layers of conductive cells of the first and second layers of conductive cells, respectively, each connector electrically connecting vertically immediately adjacent conductive cells of the vertically adjacent layers of conductive cells;
wherein the first and second layers of conductive cells include:
a plurality of first conductive cells on a first surface of the substrate; and
a plurality of second conductive cells on a second surface of the substrate,
wherein a size of each of the first conductive cells is different from a size of each of the second conductive cells.

2. The apparatus of claim 1, wherein the signal-coupling suppressor is configured to suppress an operating frequency band of the antenna elements.

3. The apparatus of claim 1, wherein the substrate includes a mount layer on which the signal-coupling suppressor is mounted,
wherein the first surface is a top surface of the mount layer, and
wherein the second surface is a bottom surface of the mount layer.

4. The apparatus of claim 3, wherein the cells and bridges are mounted on the mount layer on a top face thereof.

5. The apparatus of claim 3, wherein the substrate includes a support stack disposed beneath the mount layer.

6. The apparatus of claim 5, wherein the support stack includes a stack of multiple support layers and multiple ground layers, wherein the support layers are alternately stacked with the ground layers.

7. The apparatus of claim 1, wherein the size of each of the second conductive cells is larger than the size of each of the first conductive cells.

8. The apparatus of claim 7, wherein the plurality of bridges is only interposed between horizontally adjacent first conductive cells.

9. The apparatus of claim 7, wherein each of the plurality of bridges has one end contacting a corresponding first conductive cell and another end contacting an adjacent bridge.

10. The apparatus of claim 1, wherein the cells of the same layer are arranged in multiple rows and columns.

11. The apparatus of claim 1, wherein each of the cells has a polygonal shape.

12. The apparatus of claim 11, wherein the polygonal shape is a triangular, rectangular, or hexagonal shape.

13. A radar apparatus comprising:
a housing including an upper housing and a lower housing; and
a radar module disposed between the upper housing and the lower housing,
wherein the radar module includes:
a substrate;
multiple antenna elements mounted on the substrate; and
a signal-coupling suppressor disposed between the multiple antenna elements,
wherein the signal-coupling suppressor comprises:
first and second layers of conductive cells vertically spaced apart from each other, each layer comprising a plurality of conductive cells horizontally spaced apart from each other;
a plurality of bridges interposed between horizontally adjacent conductive cells of the first layer of conductive cells, respectively, each bridge electrically connecting the horizontally adjacent cells; and
a plurality of connectors interposed between vertically adjacent layers of conductive cells of the first and second layers of conductive cells, respectively, each connector electrically connecting vertically immediately adjacent conductive cells of the adjacent layers of conductive cells;
wherein the first and second layers of conductive cells include:
a plurality of first conductive cells on a first surface of the substrate; and
a plurality of second conductive cells on a second surface of the substrate,
wherein a size of each of the first conductive cells is different from a size of each of the second conductive cells.

14. The apparatus of claim 13, wherein the upper housing is configured to transmit a radar signal emitted from the radar module therethrough.

15. The apparatus of claim 13, wherein at least one of the upper housing and the lower housing has a dome shape.

16. The apparatus of claim 13, wherein each of the upper housing and the lower housing has a circular or polygonal shaped outer contour.

17. The apparatus of claim 13, wherein the housing is made of an electrically insulating material.

* * * * *